(12) United States Patent
Liu et al.

(10) Patent No.: US 10,225,968 B1
(45) Date of Patent: Mar. 5, 2019

(54) FIXTURE TO ENABLE POSITIONING OF SMT COMPONENTS

(71) Applicants: Fu Tai Hua Industry (Shenzhen) Co., Ltd., Shenzhen (CN); HON HAI PRECISION INDUSTRY CO., LTD., New Taipei (TW)

(72) Inventors: Eddy Liu, New Taipei (TW); Xi-Hang Li, Zhengzhou (CN); Xue-Feng Che, Shenzhen (CN); Ri-Qing Chen, Shenzhen (CN); Xing Xia, Shenzhen (CN)

(73) Assignees: Fu Tai Hua Industry (Shenzhen) Co., Ltd., Shenzhen (CN); HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 15/974,779

(22) Filed: May 9, 2018

(30) Foreign Application Priority Data

Apr. 17, 2018 (CN) .......................... 2018 1 0345187

(51) Int. Cl.
*H05K 13/00* (2006.01)

(52) U.S. Cl.
CPC ..... *H05K 13/0015* (2013.01); *H05K 13/0053* (2013.01); *H05K 13/0069* (2013.01)

(58) Field of Classification Search
None
See application file for complete search history.

(56) References Cited

U.S. PATENT DOCUMENTS

| | | | |
|---|---|---|---|
| 2008/0150640 A1* | 6/2008 | Dimitrov | H03B 15/006 331/3 |
| 2012/0261870 A1* | 10/2012 | Hsieh | H05K 3/007 269/8 |
| 2013/0135552 A1* | 5/2013 | Huang | G02F 1/133308 349/58 |
| 2017/0082827 A1* | 3/2017 | Park | G02B 7/08 |

* cited by examiner

*Primary Examiner* — Xanthia C Cunningham
(74) *Attorney, Agent, or Firm* — ScienBiziP, P.C.

(57) ABSTRACT

A fixture to enable correct positioning of components in surface mount technology (SMT) field includes a tray, a positioning mechanism, at least one first upper magnet, at least one second upper magnet, and at least one lower magnet. The tray has at least one positioning hole. The positioning mechanism includes a base member, at least one sliding assembly, and at least one positioning post. The sliding assembly is slidably mounted to the base member. The positioning post is mounted to the base member, and disposed in the positioning hole of the tray. The first upper magnet and the second upper magnet are attached to the tray. The lower magnet is attached to the sliding assembly. The tray and the positioning mechanism are repulsive when the lower magnet aligns with the first upper magnet but are attracted when the lower magnet aligns with the second upper magnet.

20 Claims, 7 Drawing Sheets

FIXTURE TO ENABLE POSITIONING OF SMT COMPONENTS

FIELD

The present disclosure relates to surface mount technology (SMT), and more particularly to an SMT positioning fixture.

BACKGROUND

A main board and a sub-board of a mobile phone are soldered together using surface mount technology (SMT). The SMT process is to apply solder paste to the main board first, then attach the sub-board to the main board, and finally put the main board with the sub-board in the reflow furnace. However, the main board and the sub-board may be misaligned when put in the reflow furnace.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure. Moreover, in the drawings, like reference numerals designate corresponding parts throughout the several views.

DETAILED DESCRIPTION

Figure 1:
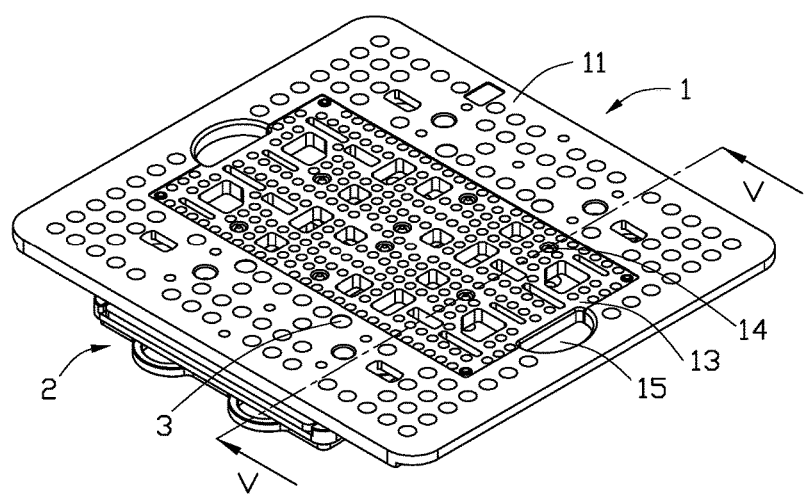
FIG. 1 is a top perspective view of an embodiment of an SMT positioning fixture.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

With reference to FIGS. 1 to 4, an SMT positioning fixture includes a tray 1, a positioning mechanism 2, a plurality of guide posts 3, at least one first upper magnet 4, at least one second upper magnet 5, and at least one lower magnet 6.

The guide posts 3 pass through the tray 1 and the positioning mechanism 2 such that the tray 1 and the positioning mechanism 2 can be moved towards or away from each other along the axes of the guide posts 3.

The tray 1 has an upper surface 11, a lower surface 12, a board receiving recess 13, at least one positioning hole 14, and two side openings 15. The board receiving recess 13 is formed in the upper surface 11. The positioning hole 14 is located in the board receiving recess 13. The two side openings 15 are located on opposite sides of the tray 1 and communicate with the board receiving recess 13.

Figure 3:
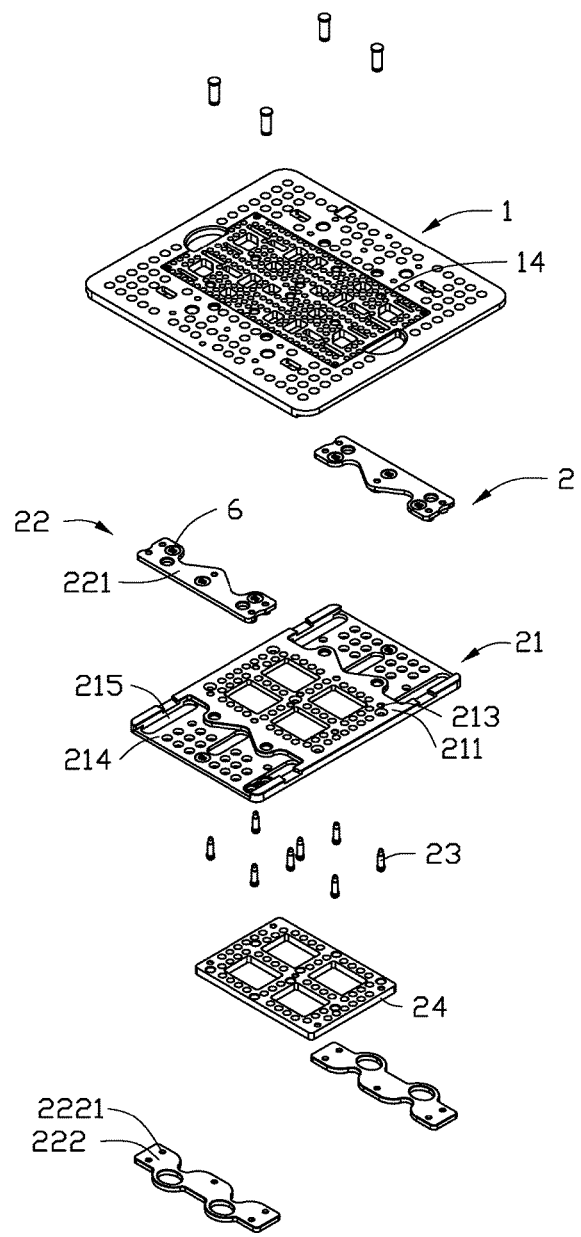
FIG. 3 is a top exploded view of the SMT positioning fixture of FIG. 1.
Figure 4:
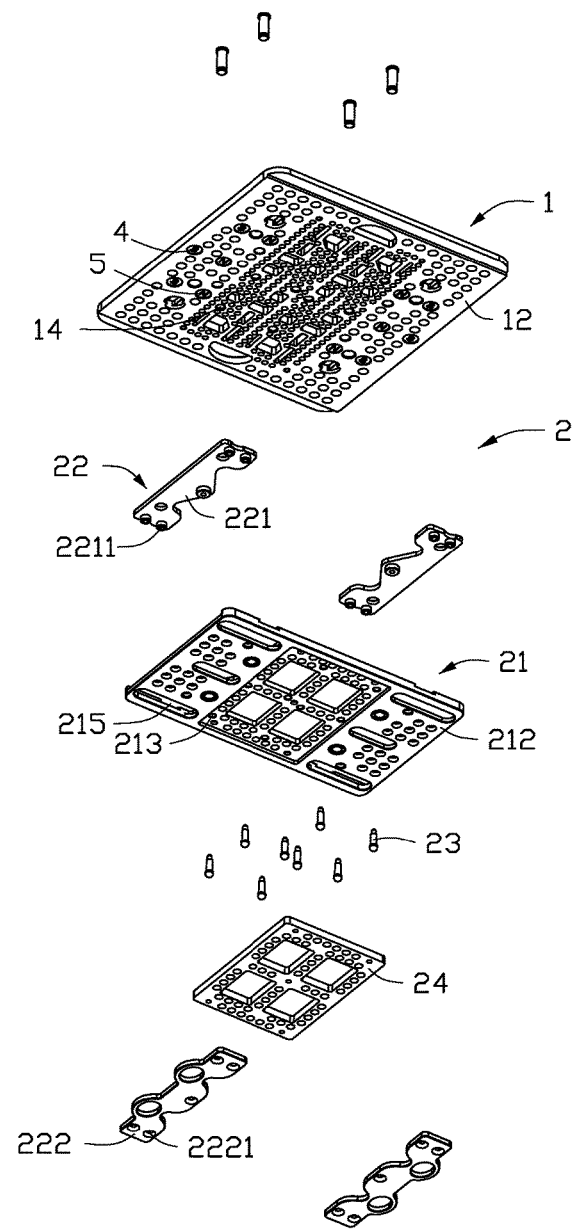
FIG. 4 is a bottom exploded view of the SMT positioning fixture of FIG. 1.

With reference to FIGS. 3 and 4, the positioning mechanism 2 includes a base member 21, at least one sliding assembly 22, at least one positioning post 23, and a securing member 24. The base member 21 has an upper surface 211, a lower surface 212, at least one positioning hole 213, at least one sliding recess 214, and a plurality of limiting holes 215. The positioning hole 213 of the base member 21 aligns with the positioning hole 14 of the tray 1. The sliding recess 214 is formed in the upper surface 211. The limiting holes 215 are located in the sliding recess 214. The sliding assembly 22 is slidably mounted to the base member 21. The sliding assembly 22 includes a slider 221 and an operating member 222. The slider 221 is slidably mounted in the sliding recess 214 of the base member 21. The slider 221 has a plurality of limiting posts 2211 extending therefrom. The limiting posts 2211 correspond to the limiting holes 215 of the base member 21. The operating member 222 is slidably mounted to the lower surface 212 of the base member 21. The operating member 222 has a plurality of bolt holes 2221 formed therein. Bolts (not shown) pass through the bolt holes 2221 of the operating member 222 and into the limiting posts 2211 of the slider 221 to secure the operating member 222 to the slider 221.

Figure 5:
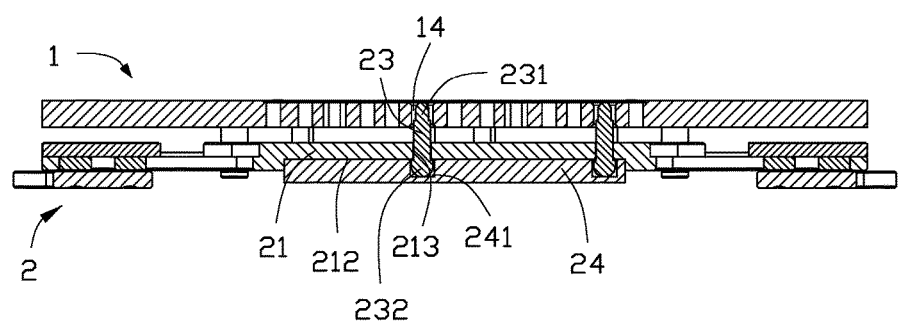
FIG. 5 is a cross-sectional view taken along line V-V of FIG. 1.

With reference to FIG. 5, the positioning post 23 passes through the positioning hole 213 of the base member 21. The positioning post 23 has an upper portion 231 and a lower portion 232. The upper portion 231 is disposed in the positioning hole 14 of the tray 1. The lower portion 232 protrudes from the lower surface 212 of the base member 21. The securing member 24 is secured to the lower surface 212 of the base member 21. The securing member 24 has at least one securing recess 241 in which the lower portion 232 of the positioning post 23 is secured.

With reference to FIG. 4, the first upper magnet 4 and the second upper magnet 5 are spaced apart, and each embedded in the lower surface 12 of the tray 1. As the first upper magnet 4 and the second upper magnet 5 face the positioning mechanism 2 they have different polarities.

With further reference to FIG. 3, the lower magnet 6 is embedded in the slider 221 of the sliding assembly 22. The pole of the lower magnet 6 facing the tray 1 has the same polarity as the pole of the first upper magnet 4 facing the positioning mechanism 2. Thus the second upper magnet 5 facing the positioning mechanism 2 will have the opposite polarity.

In the present embodiment, the SMT positioning fixture includes two groups of three first upper magnets 4, two groups of three second upper magnets 5, and two groups of three lower magnets 6. The two groups of first upper magnets 4 are embedded in opposite ends of the tray 1 adjacent to opposite end edges thereof. The two groups of second upper magnets 5 are embedded in the opposite ends of the tray 1 adjacent to a center thereof. The poles of the first upper magnets 4 facing the positioning mechanism 2 are south poles, and the poles of the second upper magnets 5 facing the positioning mechanism 2 are north poles. Two sliding recesses 214 are formed in opposite ends of the base member 21, and two sliding assemblies 22 are mounted on the opposite ends of the base member 21. The two groups of lower magnets 6 are embedded in the sliders 221 of the two sliding assemblies 22. The poles of the lower magnets 6 facing the tray 1 are south poles.

Figure 2:
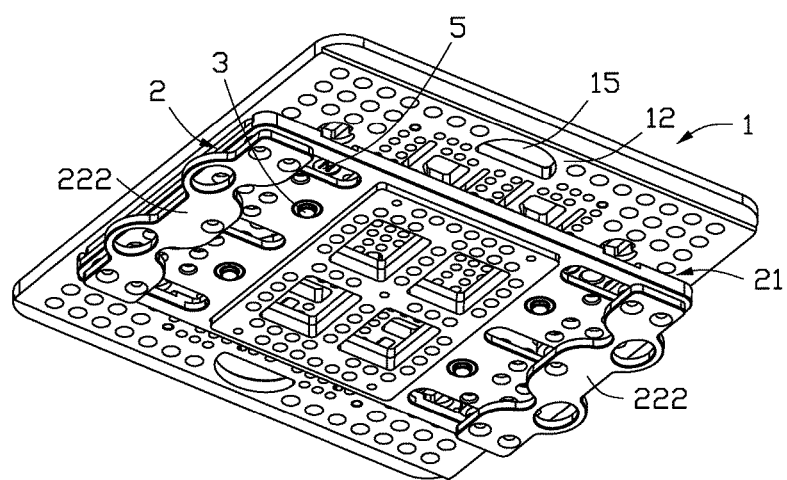
FIG. 2 is a bottom perspective view of the SMT positioning fixture of FIG. 1.

With reference to FIG. 2, in use, the operating members 222 are pulled towards the end edges of the tray 1 to move the sliders 221 relative to the base member 21 so as to align the lower magnets 6 with the first upper magnets 4. With further reference to FIG. 5, the tray 1 and the positioning mechanism 2 move away from each other because the lower magnets 6 and the first upper magnets 4 are repulsive. Under this circumstance, a main board of a mobile phone (not shown) can be placed in the board receiving recess 13 of the tray 1, and the positioning post 23 does not protrude into the main board. Therefore, solder paste can be applied to the main board.

Figure 6:
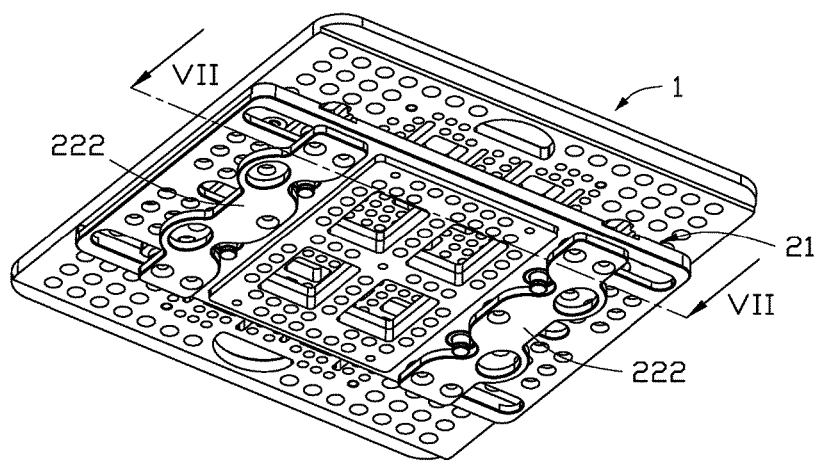
FIG. 6 is an operational bottom perspective view of the SMT positioning fixture of FIG. 1, showing operating members being moved.
Figure 7:
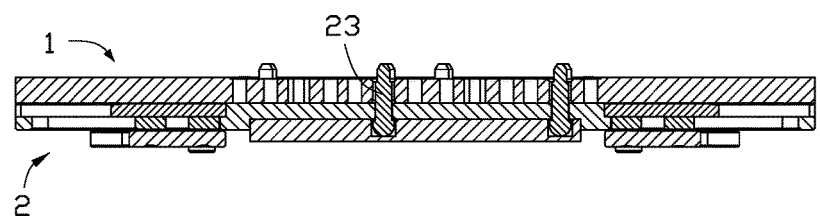
FIG. 7 is a cross-sectional view taken along line VII-VII of FIG. 6.

With reference to FIG. 6, after the solder paste has been applied, the operating members 222 are pushed towards the center of the tray 1 to move the sliders 221 relative to the base member 21 so as to align the lower magnets 6 with the second upper magnets 5. With further reference to FIG. 7, the tray 1 and the positioning mechanism 2 move towards each other because the lower magnets 6 and the second upper magnets 5 attract each other. Under this circumstance, the positioning post 23 protrudes into the main board. A sub-board of the mobile phone (not shown) can then be attached to the main board of the mobile phone, and the positioning post 23 passes through the main board and the sub-board. Thereby, the main board and the sub-board are accurately positioned in the tray 1 and misalignment is prevented.

With reference to FIG. 2, after the main board and the sub-board have been soldered together, the operating members 222 are pulled towards the end edges of the tray 1 to move the sliders 221 relative to the base member 21, so as to align the lower magnets 6 with the first upper magnets 4. With further reference to FIG. 5, the tray 1 and the positioning mechanism 2 move away from each other. Under this circumstance, the positioning post 23 does not protrude into the main board and the sub-board. Therefore, the main board with the sub-board can be taken out, or solder paste can be applied to the sub-board. In addition, the main board and the sub-board can be easily placed in and taken out through the side openings 15 of the tray 1.

The embodiments shown and described above are only examples. Many details are often found in the art such as the other features of a positioning fixture. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, especially in matters of shape, size, and arrangement of the parts within the principles of the present disclosure, up to and including the full extent established by the broad general meaning of the terms used in the claims. It will therefore be appreciated that the embodiments described above may be modified within the scope of the claims.

What is claimed is:

1. A surface mount technology (SMT) positioning fixture comprising:
    a tray having at least one positioning hole;
    a positioning mechanism comprising:
        a base member;
        at least one sliding assembly slidably mounted to the base member; and
        at least one positioning post mounted to the base member, and disposed in the positioning hole of the tray;
    at least one first upper magnet attached to the tray;
    at least one second upper magnet attached to the tray; and
    at least one lower magnet attached to the sliding assembly;
    wherein the tray and the positioning mechanism are configured to move towards or away from each other;
    wherein poles of the first upper magnet and the second upper magnet facing the positioning mechanism have opposite polarities;
    wherein a pole of the lower magnet facing the tray has the same polarity as the pole of the first upper magnet facing the positioning mechanism, and has opposite polarity to the pole of the second upper magnet facing the positioning mechanism;
    wherein when the sliding assembly is moved relative to the base member to align the lower magnet with the first upper magnet, the tray and the positioning mechanism move away from each other because the lower magnet and the first upper magnet are repulsive; and
    wherein when the sliding assembly is moved relative to the base member to align the lower magnet with the second upper magnet, the tray and the positioning mechanism move towards each other because the lower magnet and the second upper magnet attract each other.

2. The SMT positioning fixture of claim 1,
    wherein the base member has:
        at least one positioning hole aligning with the positioning hole of the tray;
    wherein the positioning post passes through the positioning hole of the base member, and the positioning post has:
        an upper portion disposed in the positioning hole of the tray; and
        a lower portion protruding from a lower surface of the base member; and
    wherein the positioning mechanism further comprises a securing member secured to the lower surface of the base member, and the securing member has at least one securing recess in which the lower portion of the positioning post is secured.

3. The SMT positioning fixture of claim 2,
    wherein the tray has:
        an upper surface; and
        a lower surface to which the first upper magnet and the second upper magnet are attached;
    wherein the base member has at least one sliding recess formed in an upper surface thereof;
    wherein the sliding assembly has a slider slidably mounted in the sliding recess of the base member; and
    wherein the lower magnet is attached to the slider of the sliding assembly.

4. The SMT positioning fixture of claim 3,
    wherein the base member has a plurality of limiting holes located in the sliding recess;
    wherein the slider has a plurality of limiting posts extending therefrom and corresponding to the limiting holes of the base member; and
    wherein the sliding assembly has an operating member slidably mounted to the lower surface of the base member and secured to the slider.

5. The SMT positioning fixture of claim 3, wherein the tray has a board receiving recess formed in the upper surface thereof, and the positioning hole of the tray is located in the board receiving recess.

6. The SMT positioning fixture of claim 4, wherein the tray has a board receiving recess formed in the upper surface thereof, and the positioning hole of the tray is located in the board receiving recess.

7. The SMT positioning fixture of claim 5, wherein the tray has two side openings located on opposite sides thereof and communicating with the board receiving recess.

8. The SMT positioning fixture of claim 6, wherein the tray has two side openings located on opposite sides thereof and communicating with the board receiving recess.

9. The SMT positioning fixture of claim 1, further comprising a plurality of guide posts passing through the tray and the positioning mechanism.

10. The SMT positioning fixture of claim 2, further comprising a plurality of guide posts passing through the tray and the positioning mechanism.

11. The SMT positioning fixture of claim 3, further comprising a plurality of guide posts passing through the tray and the positioning mechanism.

12. The SMT positioning fixture of claim 4, further comprising a plurality of guide posts passing through the tray and the positioning mechanism.

13. The SMT positioning fixture of claim 5, further comprising a plurality of guide posts passing through the tray and the positioning mechanism.

14. The SMT positioning fixture of claim 6, further comprising a plurality of guide posts passing through the tray and the positioning mechanism.

15. The SMT positioning fixture of claim 1, wherein the pole of the first upper magnet facing the positioning mechanism is a south pole, the pole of the second upper magnet facing the positioning mechanism is a north pole, and the pole of the lower magnet facing the tray is a south pole.

16. The SMT positioning fixture of claim 2, wherein the pole of the first upper magnet facing the positioning mechanism is a south pole, the pole of the second upper magnet facing the positioning mechanism is a north pole, and the pole of the lower magnet facing the tray is a south pole.

17. The SMT positioning fixture of claim 3, wherein the pole of the first upper magnet facing the positioning mechanism is a south pole, the pole of the second upper magnet facing the positioning mechanism is a north pole, and the pole of the lower magnet facing the tray is a south pole.

18. The SMT positioning fixture of claim 4, wherein the pole of the first upper magnet facing the positioning mechanism is a south pole, the pole of the second upper magnet facing the positioning mechanism is a north pole, and the pole of the lower magnet facing the tray is a south pole.

19. The SMT positioning fixture of claim 5, wherein the pole of the first upper magnet facing the positioning mechanism is a south pole, the pole of the second upper magnet facing the positioning mechanism is a north pole, and the pole of the lower magnet facing the tray is a south pole.

20. The SMT positioning fixture of claim 6, wherein the pole of the first upper magnet facing the positioning mechanism is a south pole, the pole of the second upper magnet facing the positioning mechanism is a north pole, and the pole of the lower magnet facing the tray is a south pole.

\* \* \* \* \*